United States Patent [19]

Zur

[11] Patent Number: 4,949,041
[45] Date of Patent: Aug. 14, 1990

[54] MAGNETIC RESONANCE IMAGING
[75] Inventor: Yuval Zur, Herzlia, Israel
[73] Assignee: Elscint Ltd., Haifa, Israel
[21] Appl. No.: 300,980
[22] Filed: Jan. 24, 1989
[30] Foreign Application Priority Data

Jan. 29, 1988 [IL] Israel ............................................ 85259

[51] Int. Cl.⁵ ............................................ G01R 33/20
[52] U.S. Cl. .................................................... 324/309
[58] Field of Search .............. 324/300, 307, 306, 309, 324/312; 128/653

[56] References Cited

U.S. PATENT DOCUMENTS

| 4,616,180 | 10/1986 | Compton | 324/309 |
| 4,697,149 | 9/1987 | Moran | 324/306 |
| 4,800,889 | 1/1989 | Dumoulin | 324/306 |

OTHER PUBLICATIONS

Feinberg et al., Journal of Radiology, Halving MR Imaging Time by Conjugation: Demonstration at 3.5 kg: vol. 161, pp. 527–531, 1986.

Pattany et al., Journal of Computer Assisted Tomography, Motion Artifact Suppression Technique (MAST) for MR Imaging, pp. 369–377; 1987.

Purdy et al., a Double Phase Correction/Hermitian Conjugation Procedure Improves the Quality of Half-Fourier Images.

Primary Examiner—Michael J. Tokar
Attorney, Agent, or Firm—Sandler, Greenblum & Bernstein

[57] ABSTRACT

Motion insensitive magnetic resonance scanning is provided when generating a signal from spins of a selected portion of a subject by acquiring a truncated signal comprising most of the signal's central portion and one wing of the usual two wings. Full image data is obtained by conjugating the truncated signal. The image thus obtained is relatively motion insensitive.

18 Claims, 2 Drawing Sheets

MAGNETIC RESONANCE IMAGING

FIELD OF THE INVENTION

This invention is concerned with magnetic resonance imaging (MRI) systems and more particularly with techniques and arrangements for reducing artifacts caused when spins that are manipulated to provide image data change location during the data acquisition process.

BACKGROUND OF THE INVENTION

One of the critiques of MRI has been that the images are plagued by motion caused artifacts. Artifacts due to motion appear as "ghosting" or smearing due to spin dephasing from view to view and/or a loss of signal due to the movement of spins in a single view. The artifacts due to motion become particularly severe when the time to echo (TE) values are long.

As can be expected a plethora of techniques have been offered as solutions to the motion artifact problem in body imaging. Among the prior art techniques for suppressing the motion caused artifacts have been gating techniques, rendering of the phase encoding pulse amplitudes, fast imaging techniques, and/or scan sequences that are insensitive to motion.

In general then, stationary spins are refocussed at the apex of the echo but the moving spins are not refocussed with the stationary spins because of the changing locations. Accordingly, there is spin dephasing due to motion.

None of the prior art techniques has been completely successful in removing the motion caused artifacts. For example, gating techniques require costly instrumentation, are time consuming and do nothing to correct dephasing that occurs in a single view. Further, gating limits the use of variations in such normal variables as TE or TR because the sequence is tied to the gating time.

Fast imaging techniques, such as "one-breath hold" techniques do not correct for dephasing that occurs in a view. In general, while fast imaging reduces motion artifact by reducing the sequence time, they are not nearly fast enough to prevent in-view artifacts.

The reordering techniques only work on periodic type motion, however, body motion is not periodic or only periodic as a first order approximation.

The prior art motion insensitive scan sequences use large rephasing gradients to eliminate or reduce the signal inconsistencies of the moving spins. The rephasing gradients are determined by solving equations designed to set the phase of the spins to zero at the apex of the signal.

The phase shift of a spin subjected to a gradient varying in time is given by:

$$\emptyset(t) = \gamma \int_o^t G(t')X(t')dt' \quad (1)$$

where:
γ is the gyromagnetic constant,
G(t') is the gradient amplitude at time t, and
X(t') is the position of the spin at the time t.

The position X(t) may be analyzed by expansion in a Taylor Power Series, thus:

$$X(t) = X(o) + X'(o)t/1! + X''(o)t^2/2! + X'''(o)t^3/3! + \ldots X^{[n]}(o)t^n/n! \quad (2)$$

or $$X(t) = X(o) + \sum_{n=1}^{\infty} X^{[n]}(o)t^n/n!$$

Accordingly by combining equations (1) and (2), the phase is given by:

$$\emptyset(t) = X(o)\gamma \int_o^t G(t')dt' + \quad (3)$$

$$X'(o)\gamma \int_o^t G(t')t'dt' + \frac{X''(o)}{2!} \gamma \int_o^t G(t')t''^2 dt + \ldots$$

By setting this equation equal to zero, values for the gradients to give zero phase shift for spins in motion can derived and solved. See for example, the article "Motion Artifact Suppression Technique (MAST) for MR Imaging" by P. M. Pattany et al in the Journal of Computer Assisted Tomography, Vol. 11(3) pp 369-377 May/June 1987. The gradients thus obtained will provide a motion insensitive scan sequence.

However, there are problems with this technique. Among the problems are that the gradients described by the solution to the equation are relatively large and have finite rise times and therefore, cause eddy current problems. In addition, the tailoring and timing of the gradients has to be practically perfect to obtain the zero phase shift desired, such perfection is not easy to achieve. Still further, the use of the large gradient pulses tends to increase the time to echo TE. Thus a minimum time to echo problem is created.

Accordingly, those skilled in the art are continuing to search for methods and apparatus to obtain motion insensitive data in magnetic resonance imaging systems without the necessity of using rephasing gradients that cause the eddy current problems and require accurate tailoring and timing.

A related objective is to reduce view to view motion caused artifacts and to practically eliminate motion caused loss of signal that occurs in a single view.

BRIEF DESCRIPTION OF THE INVENTION

According to a broad aspect of the present invention, a method of obtaining zero phase shift for both moving and stationary spins in the received signal in a magnetic resonance imaging system is provided; said method comprising the steps of:

generating a signal from the spins of a selected portion of an object, sampling the signal, and applying a view gradient pulse that begins its maximum positive position only slightly before the apex of the said signal, whereby since the gradient G(t) is practically zero the phase is also practically zero.

Thus, the method takes cognizance of the fact that in the equation (1) the phase of the received signal is zero when the gradient is zero. Accordingly, no dephasing gradients are applied until the signal is to be received. Thus zero gradient is used rather than attempting to cancel the gradient by using the large shaped "cancelling" gradients of the prior art.

However, the above signal measuring method provides a truncated received signal adversely effecting the ability to provide sufficient resolution. A small negative hook like area is added to the view gradient to improve the resolution of the image. The additional hook-like section received signal includes practically the entire center of the signal. With the data from the center, the unmeasured amplitude data phase can be obtained and phase corrections can be accomplished using the procedures used in single side encoding or half-Fourier imaging. See for example, a paper presented at the SMRM ('87) conference by D. E. Purdy et al entitled "A Double Phase Correction/Hermitian Conjugation Processor Improves the Quality of Half Fourier Images".

Reconstruction of images acquired using half Fourier imaging requires full use of the image amplitudes and phases as measured with phase correction and conjugation to provide data over the entire image. More particularly, the acquired central portion of the signal along with the measured tail on one side are used to construct both tails. First in a preferred embodiment, the acquired single side encoded signal is broken into component parts comprising the center section and the two tail sections—one of which contains measured data and the other tail section is constructed by half Fourier techniques. The result provides practically distortion free images.

For generalized discussion of half Fourier imaging, see "Halving MR Imaging by Conjugation Demonstration at 3.5 KG" by D. A. Feinberg et al, which appeared in the journal Radiology, Vol. 161, pp 527-531 (1986).

It should be noted that the invention is sufficiently broad to encompass FID or echo signals. It is of little consequence what type of signals are sampled. Thus, for example the signals can be echo signals obtained by spin echo sequences or obtained by using gradient sequences.

Using the gradient pulse slightly before the apex of the generated spin signal results in acquisition of data that is insensitive to motion. The acquisition of data that is insensitive to motion is what enables suppression of motion caused artifacts.

BRIEF DESCRIPTION OF THE DRAWINGS

The above mentioned and other objects and features of the present will be better understood when considered with the following description of a broad aspect of the invention made with reference to the accompanying drawings; wherein.

GENERAL DESCRIPTION

Figure 1:
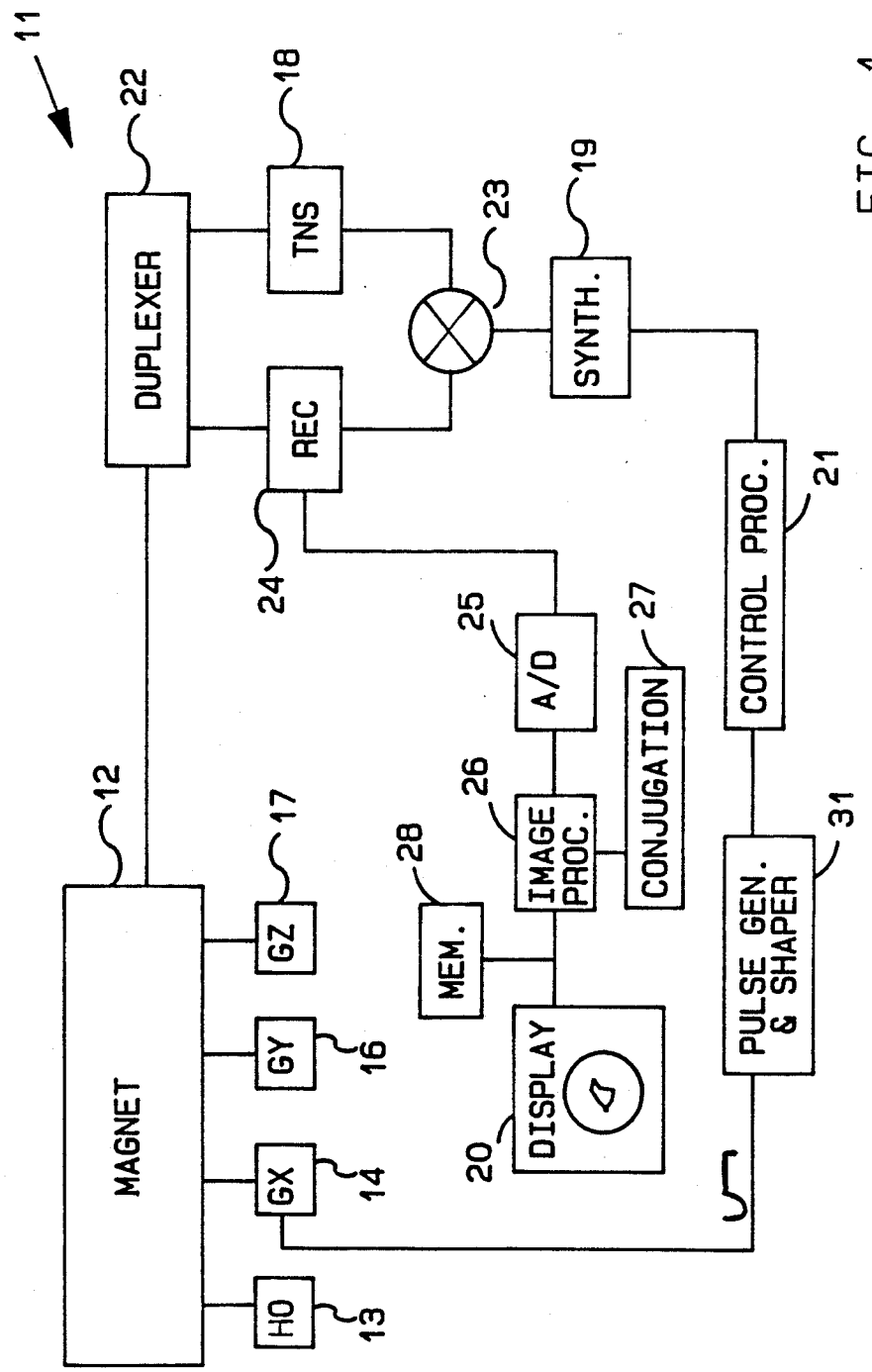
FIG. 1 is a typical magnetic resonance imaging system for use in acquiring motion insensitive spin data.

FIG. 1 shows a typical magnetic resonance imaging system comprising a magnet 12 for receiving a patient therein. In a preferred embodiment the magnet is a superconducting magnet; but, within the scope of this invention other types of magnets can be used.

A large static, relatively homogeneous, magnetic field Bo is generated by field generator HO indicated at 13. The large static field causes nucleii "spins") having an odd number of protons and/or neutrons to align with the static field. Gradient fields are generated by the gradient field generators Gx indicated at 14 Gy indicated at 16 and Gz indicated at 17. The gradient fields in a preferred embodiment are orthogonal to each other with the field Gz generally being coaxial with the large static magnetic field Bo. The gradient fields are used to vary the large magnetic field in a known manner to enable spatially locating the source of signals received from within the subject placed in the magnet.

Means are provided for generating radio frequency (RF) pulses for "tipping" the aligned spins into the transverse or "XY" plane so as to have a component in the transverse plane. The means for tipping the spins comprises RF coils (not shown) in the magnet and the RF pulse transmitter 18. The RF pulse transmitter 18 is supplied with an RF frequency signal by synthesizer 19 controlled by control processor 21. Note that the control processor controls the timing and amplitudes of the outputs of the various component parts making up the MRI system.

The transmitted pulse goes through a duplexer 22 to the RF coil in the magnet. The synthesizer signal is coupled to the transmitter when the system is in the transmitting mode through switch means 23. The RF coils are geometrically located so that they are "cut" by variations in the field in the XY plane. It should be noted that separate RF coils or the same RF coils can be used for both transmitting and receiving portions of the scan sequences.

In the receiving mode the RF coil senses free induction decay (FID) or echo signals caused by the spins that have been tipped into the XY plane. The echo signals are formed by various methods as is well known such as through the use of a 180 degree pulse supplied at a time tau ($\tau$) after the application of the 90 degree pulse. After a similar time span ($\tau$) an echo signal appears.

Alternatively, or simultaneously echo signals can also be caused by inverting gradient signals to cause the normally relaxing spins in the XY plane to cohere to form the echo at the echo time.

In the past it has been almost impossible using echo sequences to obtain in-phase data of all of the first and higher order derivatives of the location components. In other words, the stationary spins, the spins having a velocity, the spins having an acceleration and the spins having a jerk are at different phases at the time the signal is acquired. The stationary spins and the moving spins cohere at different times. Special steps have been taken in the past to assure that the coherence of the different derivatives occurs at the same time. The special steps have been primarily the use of specially tailored large magnetic field gradients.

In FIG. 1 the received RF signal goes through duplexer 22 which is switched by control processor 21 into the receiving mode to connect the RF coil to the receiver 24. The received signal then passes through an analog to digital converter 25. The output of the converter 25 is applied to an image processor 26. The image processor 26, according to one aspect of the invention, has an associated conjugation circuit 27 and memory means 28. The output of the image processor is connected to the display unit 29. The unique motion insensitive system described herein uses a specially placed and shaped read gradient pulse. To emphasize the use of such a gradient pulse, a pulse generator and shaper circuit 31 is shown between the control processor 21 and the GX gradient amplifier 14.

Figure 2A:
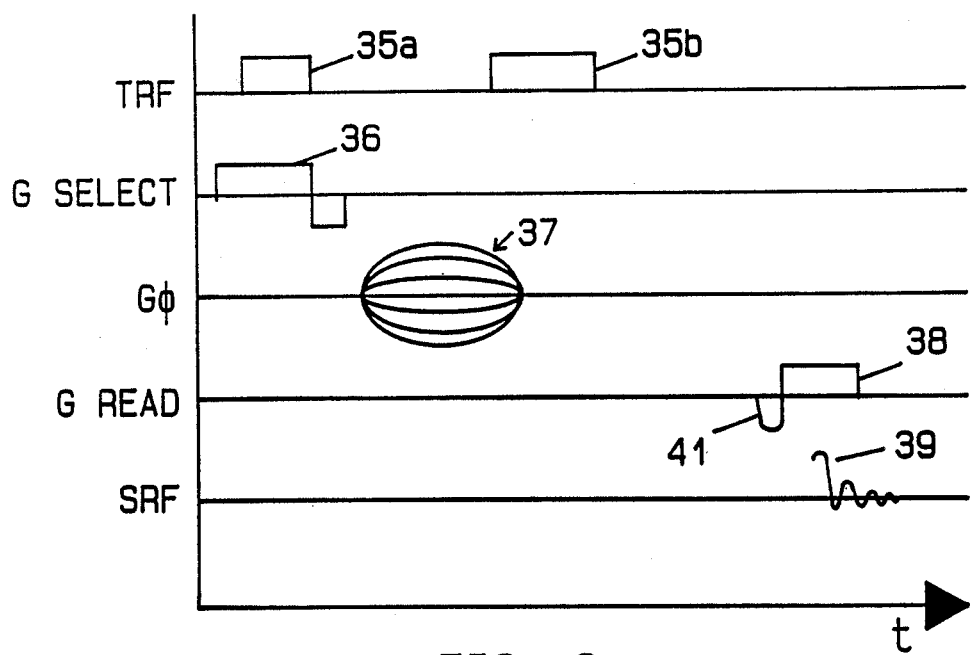
FIG. 2a and 2b shows scan sequences of the present invention.
Figure 2B:
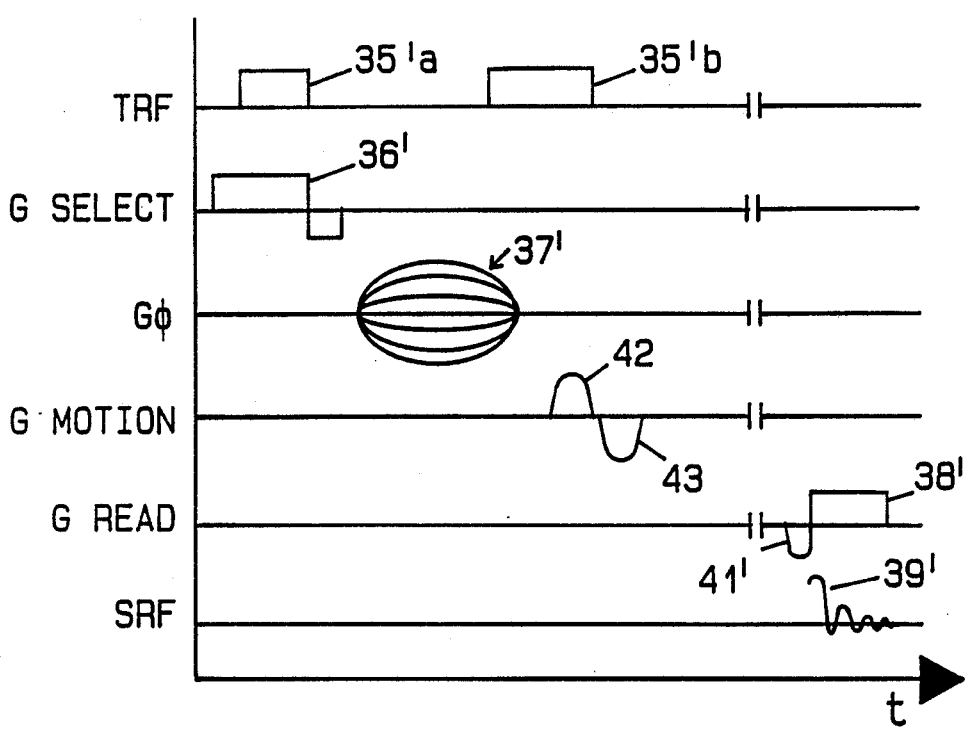

FIG. 2a shows a scan sequence useful to obtain motion insensitive spin data in the view direction in accordance with the invention with the phase of the obtained signals being substantially equal to zero. FIG. 2b provides a scan sequence for obtaining data only from stationary spins while the moving spins are displaced and provide zero signal.

In FIG. 2a, an echo signal 39 is shown where a 90 degree RF spin tipping pulse 35a is provided followed by a 180 degree spin reversing pulse 35b. The RF pulses are separated by a time period tau (τ). The RF pulse 35a can be transmitted with or without a slice selecting gradient 36. A phase encoding gradient 37 is shown between the RF pulses 35a, 35b. A read or view gradient pulse 38 is provided which is timed so that its maximum positive portion is slightly before the high point of the echo signal 39. To obtain sufficient data for half-Fourier transformation, a hook portion 41 is shown as an integral part of the read or view gradient. The area of the hook portion 41 is very small compared to the area of regular positive portion of the gradient 38.

The data obtained from this sequence; i.e. the echo signal 39 is at zero phase and insensitive to motion. Therefore the data includes signal information from both moving and stationary spins. The whole sequence provides a motion insensitive image.

The sequence of FIG. 2b provides data only from the moving spins. More particularly the sequence shows a 90 degree spin tipping RF pulse 35'a optionally sent simultaneously with the application of a slice selection pulse 36'. After a time period tau, a 180 degree spin reversing pulse 35'b is applied. Phase encoding pulses 37' are shown as being applied between the application of the RF pulses. Opposite going motion encoding pulses are shown as pulses 42 and 43. These motion encoding pulses enable the data acquisition from only the moving spins. The motion encoding pulses have no effect on stationary spins but do effect the spins that are in motion regardless of whether the motion is a linear velocity or higher order motions.

Again, the read pulse 38' is timed just as it was in the sequence of FIG. 2a, so that the positive portion 38' of the pulse begins slightly before the apex of the spin echo signal 39'. This timing assures that the phases of the acquired signals are zero. A hooked portion 41' integral to the pulse 38' is needed for phase correction. The hooked portion enables the efficient acquisition of sufficient data to successfully accomplish the phase correction and perform the half-Fourier reconstruction. The motion encoding pulses 42, 43 cancel each other out in the stationary spins; but, not in the moving spins which do not cohere.

Thus, by subtracting the stationary data the sequence of FIG. 2b from the motion insensitive data of FIG. 2a; i.e., the data from the moving spins only are imaged. Thus, the system provides total spin data, data from moving spins and data from stationary spins as illustrated by the sequences of FIG. 2a and FIG. 2b.

Further, by utilizing subtraction methods angiographic images may be provided.

The scan sequence as illustrated does not require the relatively large tailored rephasing gradients used by the prior art. Also note that there is no problem of timing of the read gradient which is operated to appear slightly prior to the apex of the echo signal.

While the invention has been described in relation to certain embodiments of the invention it should be understood that the description is made by way of example only and not to act as limitation on the scope of the invention.

What is claimed is:

1. A method of providing motion insensitive scanning in a magnetic resonance imaging system, said method comprising the steps of:
   inserting a patient into a large static magnetic field to align spins in the patient with the large static magnetic field,
   subjecting the spins in the patient to radio frequency pulses to cause the spins to be tipped from alignment with the large static magnetic field,
   detecting a signal from the tipped spins,
   said signal normally having a leading wing, a central section rising to an apex and falling to a trailing wing,
   applying gradient pulses to localize the signal source to a selected portion of the patient,
   said step of applying gradient pulses including the step of applying a view gradient pulse that begins its maximum amplitude after said leading wing section and before the apex of said signal,
   Fourier transforming a digitized signal to obtain digitized data, and
   using single side encoding techniques that comprise conjugating said digitized data to acquire full image data, said reconstructed image being insensitive to motion and thereby significantly reducing motion artifacts.

2. The method of claim 1 including using a hook-like opposite going gradient pulse section integral to the beginning of said view gradient, said hook-like section covering a relatively small area.

3. The method of claim 2 wherein the step of generating a signal from the spins comprises using an echo producing scan sequence.

4. The method of claim 3 wherein said signal is truncated comprising most of the central portion of the signal and one wing of the usual two wings.

5. The method of claim 4 including the step of phase correcting said full image data.

6. The method of claim 5 including the steps of breaking a single side encoded signal into component parts comprising one wing and the central section and constructing the other wing by conjugation.

7. A method for providing motion insensitive signals in a magnetic resonance system comprising the steps of:
   subjecting a patient to a large static magnetic field,
   said large static magnetic field aligning spins in the patient,
   subjecting the patient to a first RF pulse for tipping the spins away from alignment,
   said tipped spins dephasing in a plane perpendicular to the direction of alignment,
   causing said spins in the plane perpendicular to the direction of alignment to rephase to form an echo signal,
   starting the detection of the echo signal simultaneously with the application of a positive view gradient pulse,
   said view gradient pulse having a small negative hook-like area followed by a positive mesa-like section, and
   said acquired signal normally having a central section rising to an apex and declining to lagging wing section, half of said central portion of the acquired signal and the lagging wing section being acquired during said positive mesa-like section of the view gradient pulse.

8. The method of claim 7 and the step of converting said method for providing motion insensitive scanning to a method of acquiring signals only from moving spins.

9. The method of claim 8 wherein said step of converting includes applying positive and negative motion encoding gradient pulses.

10. An arrangement for providing motion insensitive scanning in a magnetic resonance imaging system, said arrangement comprising:

means for generating a large static magnetic field into which patient is inserted for aligning spins in the patient, means for subjecting the patient in the large static magnetic field to an RF pulse for tipping the aligned spins in the patient away from alignment, said tipped spins have at least a projection in a plane perpendicular to the direction of the aligned spins, said tipped spins rephasing in said plane perpendicular to the direction of the aligned spins, means for rephasing said dephasing spins to provide an echo signal, single-side encoding means for applying gradient pulses to the patient to localize the source of the echo signal in the patient, said echo signal including a leading wing having a relatively low magnitude a central section wherein the amplitude rises to an apex and the decays to a lagging wing also having a relatively low magnitude, said single-side encoding means for generating gradient pulses including means for applying a view gradient pulse that begins its maximum amplitude after said leading wing section and before the apex of the central portion of said signal, means for detecting the signal, and Fourier analysis means using said detected signal to reconstruct an image, and Fourier analysis means comprising half Fourier transform means, and means for conjugating the data resulting from the half-Fourier transform means to acquire full image data that is insensitive to motion thereby significantly reducing motion artifacts.

11. The system of claim 10 including means for applying a hook-like opposite going gradient pulse section integral to the beginning of said view gradient, said hook-like section covering a relatively small area.

12. The system of claim 10 wherein said detected signal is truncated comprising most of the central portion of the signal and one wing of the usual two wings.

13. The system of claim 12 including means for phase correcting said full image data.

14. The system of claim 13 including means for breaking a single side encoded signal into component parts comprising one wing section and the central section and means for constructing the other wing section by conjugating the measured portion.

15. The system of claim 10 and means for converting said motion insensitive scanning which acquires signals from moving spins and stationary spins to moving spin scanning which acquires signals only from moving spins.

16. The system of claim 15 wherein means for converting includes means for applying positive and negative motion encoding gradient pulses.

17. A system for providing motion insensitive signals from a magnetic resonance imaging (MRI) system, said system comprising:

means for generating a large static magnetic field to align spins in a patient with said large magnetic field, means for tipping the aligned spins away from alignment with said large magnetic field such that at least a projection of said tipped spins is in a place perpendicular to said large magnetic field, said spins dephasing in said plane to generate dephasing in said plane, means for rephasing said spins to form echo signals, means for detecting said echo signals, means for determining the location of the sources of said echo signals, said means for determining the location of the sources of said echo signals comprising a gradient pulse generating means, said gradient pulse generating means including means for generating a view gradient pulse, said echo signal comprising a wing section leading to a central section rising to an apex and declining to a lagging wing section, and said view gradient being applied such that the application of the maximum of the view gradient occurs simultaneously with the apex of the echo signal.

18. The system of claim 17 wherein said view gradient has a small area negative hook-like section followed by a positive mesa like section, half of a center portion of the signal and the lagging wing section being acquired during said positive mesa like section.

* * * * *